United States Patent
Dong et al.

(10) Patent No.: US 12,482,761 B2
(45) Date of Patent: Nov. 25, 2025

(54) SEMICONDUCTOR DEVICE PACKAGE HAVING IMPROVED CONDUCTIVE STUB COVERAGE

(71) Applicant: SANDISK TECHNOLOGIES, INC., Milpitas, CA (US)

(72) Inventors: Simon Dong, Shanghai (CN); Hope Chiu, Shanghai (CN); Weiting Jiang, Shanghai (CN); Elley Zhang, Shanghai (CN); Kent Yang, Hsinchu (TW); Hua Tan, Shanghai (CN); Jerry Tang, Shanghai (CN); Rui Guo, Shanghai (CN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 554 days.

(21) Appl. No.: 17/510,212

(22) Filed: Oct. 25, 2021

(65) Prior Publication Data
US 2023/0129628 A1   Apr. 27, 2023

(51) Int. Cl.
*H01L 23/552* (2006.01)
*H01L 23/00* (2006.01)
*H01L 23/538* (2006.01)

(52) U.S. Cl.
CPC ........ *H01L 23/552* (2013.01); *H01L 23/5386* (2013.01); *H01L 24/14* (2013.01)

(58) Field of Classification Search
CPC ............. H01L 23/552; H01L 23/49838; H01L 23/5386; H01L 23/49548; H01L 23/49541; H01L 23/3114; H01L 23/57–576; H01L 23/556; H01L 21/4828; H01L 21/4846–4867; H05K 1/0215; H05K 1/0216–0236; H05K 1/028–0283; H05K 1/0298; H05K 3/06–07; H05K 2201/0919; H05K 2201/09145; H05K 2201/09354; H05K 2201/09736

See application file for complete search history.

(56) References Cited

U.S. PATENT DOCUMENTS

| | | | |
|---|---|---|---|
| 2015/0131254 A1* | 5/2015 | Kim | H05K 1/111 216/13 |
| 2018/0286816 A1* | 10/2018 | Kitazaki | H01L 23/3121 |
| 2020/0176391 A1* | 6/2020 | Lim | H01L 23/49838 |
| 2020/0312781 A1* | 10/2020 | Signorini | H01L 23/49816 |
| 2021/0202409 A1* | 7/2021 | Kung | H01L 23/49822 |
| 2023/0122767 A1* | 4/2023 | Deguchi | H05K 1/0218 257/701 |

* cited by examiner

*Primary Examiner* — Yu Chen
(74) *Attorney, Agent, or Firm* — Morgan, Lewis & Bockius LLP

(57) ABSTRACT

A semiconductor device package includes a multi-layer substrate including a bottom layer and a top layer. One or more dies are mounted on and electrically coupled to the top layer of the substrate. An electromagnetic interference (EMI) shield encapsulates the substrate and the semiconductor dies. A first plurality of conductive stubs is positioned around edges of the top layer of the substrate. Each of the conductive stubs includes an edge portion having a first thickness and in contact with the EMI shield. A second plurality of conductive stubs is positioned around edges of the bottom layer of the substrate. Each of the second plurality of conductive stubs includes an edge portion having a second thickness less than the first thickness and in contact with the EMI shield.

20 Claims, 5 Drawing Sheets

SEMICONDUCTOR DEVICE PACKAGE HAVING IMPROVED CONDUCTIVE STUB COVERAGE

BACKGROUND

An embedded die package with electromagnetic interference (EMI) protection may include one or more semiconductor dies packaged together on a substrate. The dies and substrate are encapsulated and covered by an EMI shield. The assembly process for such a package typically includes operations that apply forces to the bottom of the substrate. Such forces can cause conductive material in the assembled package to be unprotected by the EMI shield, which negatively affects EMI characteristics of the package.

SUMMARY

The present disclosure describes an embedded die package having modified conductive stubs that provide for enhanced EMI characteristics of the package.

In one implementation, a semiconductor device package includes: a substrate having a plurality of layers including a bottom layer and a top layer; one or more dies mounted on and coupled to the top layer of the substrate with a plurality of bond wires, an EMI shield encapsulating the substrate and the one or more semiconductor dies; a first plurality of conductive stubs positioned around edges of the top layer of the substrate, wherein each of the first plurality of conductive stubs includes an edge portion having a first thickness and in contact with the EMI shield; and a second plurality of conductive stubs positioned around edges of the bottom layer of the substrate, wherein each of the second plurality of conductive stubs includes an edge portion having a second thickness less than the first thickness and in contact with the EMI shield.

In some implementations, each of the second plurality of conductive stubs further includes a central portion having a thickness greater than the second thickness. In some implementations, each of the first plurality of conductive stubs further includes a central portion having a thickness equal to the thickness of the central portion of each of the second plurality of conductive stubs.

In some implementations, the EMI shield fully covers each of the first and second pluralities of conductive stubs.

In some implementations, the second thickness is set such that the second plurality of conductive stubs 318 does not come into contact with a tape adhesive layer during an EMI shield assembly operation.

In some implementations, the substrate further includes at least one middle layer, each including a third plurality of conductive stubs in contact with the EMI shield 230; and each conductive stub of the third plurality of conductive stubs includes an edge portion having a thickness greater than the second thickness. In some implementations, the thickness of the edge portion of each of the third plurality of conductive stubs is equal to the first thickness.

In some implementations, each conductive stub included in the substrate is patterned over dielectric material and covered by a solder mask.

In some implementations, each conductive stub included in the substrate is copper, and the EMI shield is metal, carbon, ceramic, or polymer.

In some implementations, for each of the second plurality of conductive stubs, the edge portion is integrally formed with the central portion and positioned between the central portion and the EMI shield.

In some implementations, for each of the second plurality of conductive stubs, the edge portion is joined with the central portion at a junction comprising a step. In some implementations, a bottom surface of each of the second plurality of conductive stubs includes a step at the junction of the edge portion and the central portion.

In some implementations, the substrate includes a planar bottom surface, and a distance from the bottom surface of the substrate to the central portion of each of the second plurality of conductive stubs is less than a distance from the bottom surface of the substrate to the edge portion of the second plurality of conductive stubs.

In another aspect of the implementations described herein, a multi-layer substrate for a semiconductor device includes: an edge region configured for contact with an EMI shield; a central region connected to the edge region; and a plurality of metal layers separated by non-conductive layers, including a top metal layer and a bottom metal layer; wherein the bottom metal layer has a first thickness in a location corresponding to the central region of the substrate and a second thickness less than the first thickness in a location corresponding to the edge region of the substrate.

In some implementations, the top metal layer has a thickness greater than the second thickness in a location corresponding to the edge region of the substrate. In some implementations, the top metal layer has a thickness equal to the first thickness in a location corresponding to the central region 360 of the substrate. In some implementations, the top metal layer is configured for coupling to one or more dies with a plurality of bond wires.

In another aspect of the implementations described herein, a substrate includes a top surface configured for electrically connecting to one or more integrated circuits mounted thereon; a top layer having first electrical contact means for contacting an EMI shield, the first electrical contact means having a first thickness; and a bottom layer having second electrical contact means for contacting the EMI shield, the second electrical contact means having a second thickness less than the first thickness.

In some implementations, the first electrical contact means include a first plurality of conductive stub edges having the first thickness. In some implementations, the second electrical contact means include a second plurality of conductive stub edges having the second thickness.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
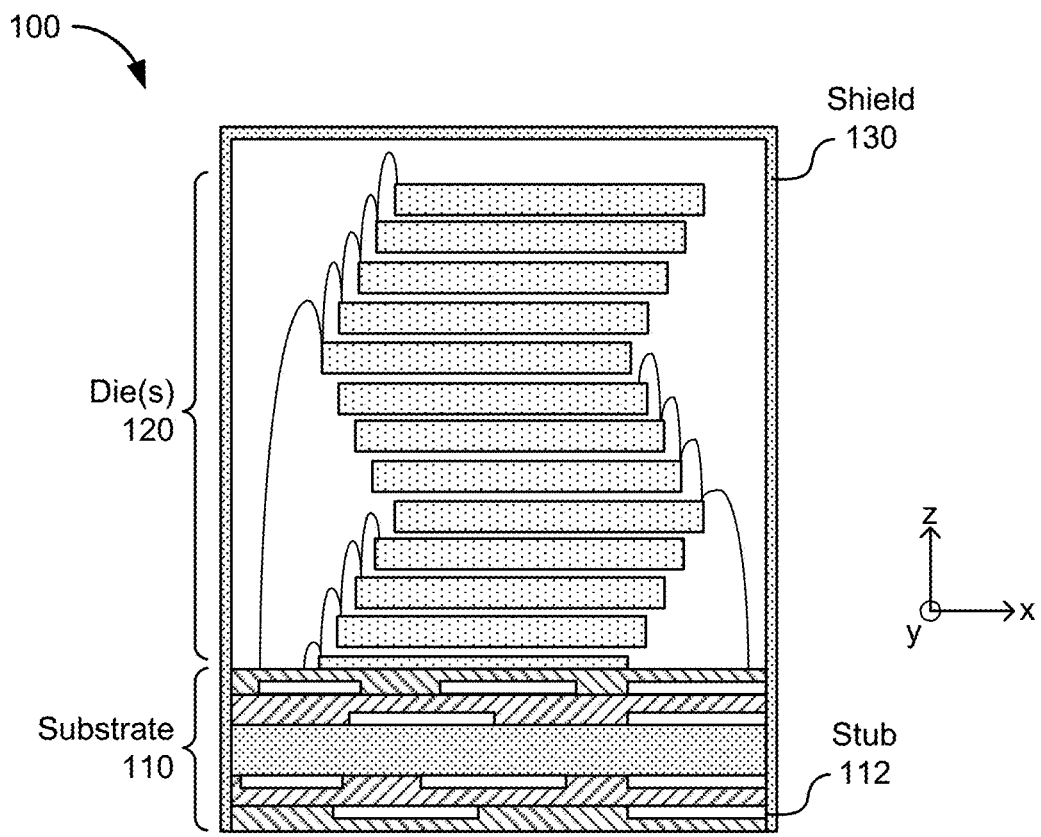
FIG. 1A is a cross-sectional side view of a portion of a semiconductor device package having a multi-layer substrate and a plurality of semiconductor dies in accordance with some implementations.

FIG. 1A is a cross-sectional side view of a semiconductor device package 100 having a multi-layer substrate 110 and one or more semiconductor dies 120 encapsulated by an electromagnetic interference (EMI) shield 130 in accordance with some implementations. Package 100 may also be referred to as an embedded die package with EMI protection, in which one or more dies are packaged together on a substrate, encapsulated, and covered by an EMI shield. Dies 120 may include, for example, one or more memory dies (e.g., NAND dies), ASIC dies, controller dies, flip-chip dies, etc.

The one or more dies 120 are mounted on and electrically connected to a top surface of the substrate 110. The substrate 110 may have multiple layers (also referred to as planes). In some implementations, the substrate 110 includes one or more signal planes, a power plane, and a ground plane. Each layer includes a plurality of conductive stubs 112 (e.g., copper stubs) extending to the edges of the substrate 110 in contact with the EMI shield 130.

Figure 1B:
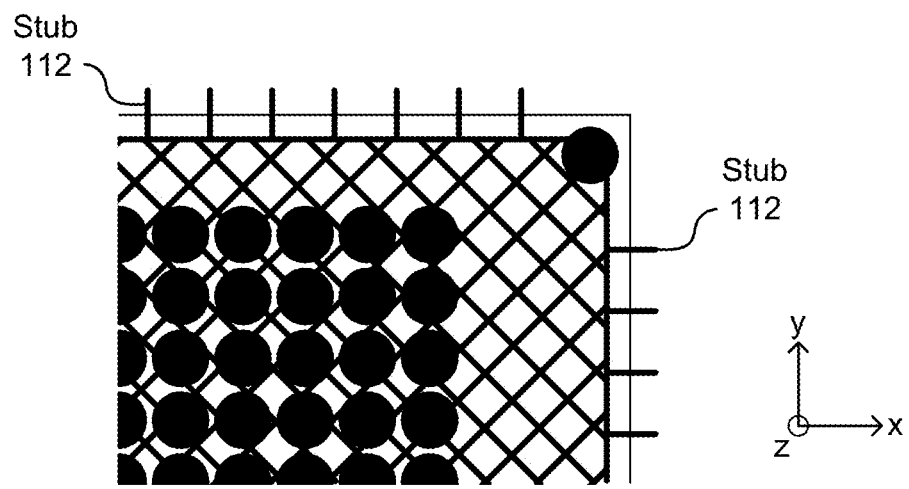
FIG. 1B is a bottom view of a portion of the multi-layer substrate of FIG. 1A.

FIG. 1B is a bottom view of a portion of the multi-layer substrate 110 of FIG. 1A. The figure shows conductive material (e.g., copper) patterned into the bottom layer of the substrate. The conductive material includes a plurality of conductive stubs 112 at the edges of the substrate. Although FIG. 1B only shows the bottom layer of the substrate, at least one of the other layers of the substrate also includes conductive stubs at the edges of the substrate.

In some implementations, the conductive stubs 112 enhance EMI characteristics of package 100 by grounding the shield 130. In addition, the conductive stubs 112 enhance mechanical characteristics of package 100 by stabilizing the shield 130.

FIGS. 2A-2D are enlarged cross-sectional side views of an edge region of the multi-layer substrate of FIGS. 1A-1B in accordance with some implementations. The substrate includes four layers: a top layer 202, two middle layers 204 and 206, and a bottom layer 208. Middle layers 204 and 206 are disposed between top layer 202 and bottom layer 208. While two middle layers are shown in the illustrated implementation, other implementations may have fewer or more than two middle layers. An area 200 above the substrate houses the one or more dies (not shown).

Each layer of the multi-layer substrate includes a plurality of conductive stubs. As FIGS. 2A-2D are cross-sectional views, the figures only show one stub in each layer. However, each layer includes a plurality of stubs (as shown in FIG. 1B).

Figure 2A:
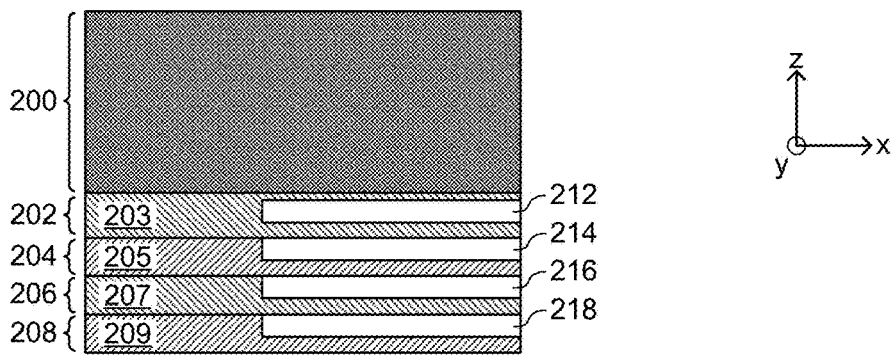
FIGS. 2A-2D are enlarged cross-sectional side views of an edge region of the multi-layer substrate of FIGS. 1A-1B including a conductive stub that is uncovered by an EMI shield.

Referring to FIG. 2A, top layer 202 includes dielectric (non-conductive) material 203, throughout which conductive stubs 212 are positioned. Middle layer 204 includes dielectric material 205, throughout which conductive stubs 214 are positioned. Middle layer 206 includes dielectric material 207, throughout which conductive stubs 216 are positioned. Lastly, bottom layer 208 includes dielectric material 209, throughout which conductive stubs 218 are positioned.

Figure 2B:
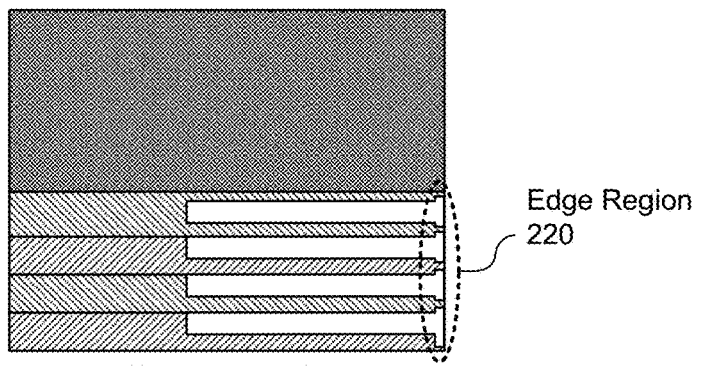

Conductive stubs 212, 214, 216, and 218 are located at an edge region 220 of the substrate. During assembly, multiple substrates may be formed on a single board before the substrates are separated. The substrates may be separated using a saw (e.g., depaneling with a circular blade). During this separation process, edge portions of the conductive stubs at the edge 220 of the substrate may be deformed by the saw, due to the ductility of the conductive material (e.g., copper). Specifically, the edges of the conductive stubs may be expanded or elongated (e.g., in a vertical direction) by the saw, as shown in FIG. 2B.

Figure 2C:
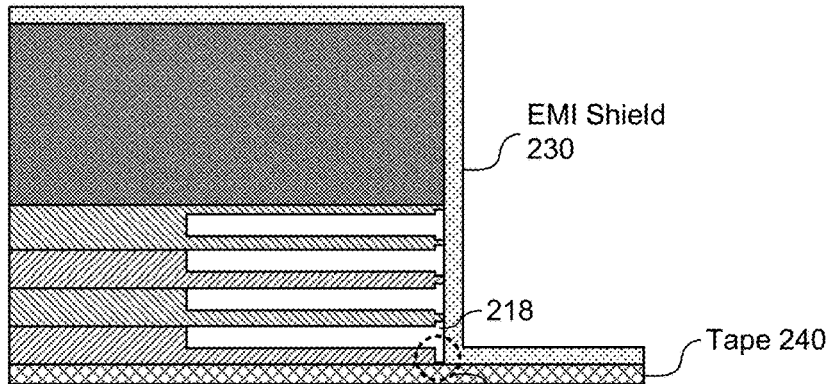
Figure 2D:
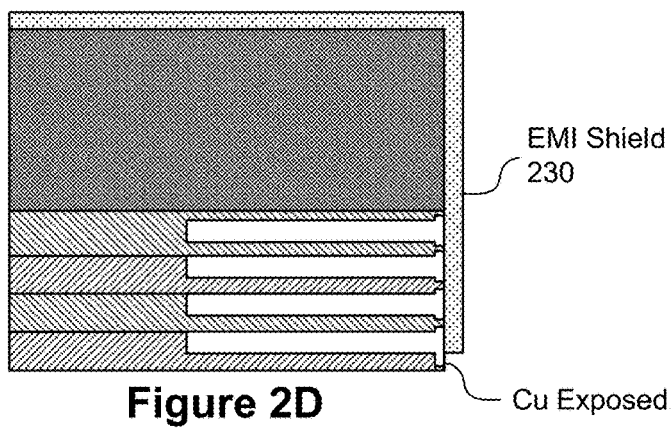

When installing the EMI shield 230 during assembly, adhesive tape 240 may be applied to the bottom of the package to temporarily fix the position of the substrate, as shown in FIG. 2C. When the tape 240 is removed (referred to as detaping), the edges of conductive stubs 218 in the bottom layer 208 (which were in contact with the tape 240) may be left exposed due to external force applied by the tape removal, as shown in FIG. 2D. In some implementations, for example, a portion of EMI shield 230 that covers the edges of bottom layer 208 may be peeled away from stubs 218 during detaping, resulting in the exposure of the stubs. Exposed stubs may negatively affect EMI characteristics of the package.

FIGS. 3A-3D are enlarged cross-sectional side views of an edge region of the multi-layer substrate of FIGS. 1A-1B, including modified conductive stubs in the bottom layer of the substrate that are covered by an EMI shield.

To prevent the conductive stubs of the bottom layer from being exposed, the edges of the conductive stubs in the bottom layer may be modified so they are thinner than the edges of conductive stubs in other layers of the substrate. The thinner edges of the conductive stubs in the bottom layer may still expand after substrate separation, but the expanded edges still have clearance from the bottom of the substrate. This clearance prevents contact between the conductive stubs in the bottom layer and the adhesive tape during EMI shield installation, so when the tape is removed, the edges of the conductive stubs in the bottom layer are not left exposed. The following discussion includes a more detailed description of the modified conductive stubs in the bottom layer of the substrate.

The illustrated substrate includes four layers: a top layer 202, two middle layers 204 and 206, and a bottom layer 308. Middle layers 204 and 206 are disposed between top layer 202 and bottom layer 308. While two middle layers are shown in the illustrated implementation, other implementations may have fewer or more than two middle layers. An area 200 above the substrate houses the one or more dies (not shown).

Each layer of the multi-layer substrate includes a plurality of conductive stubs. As FIGS. 3A-3D are partial cross-sectional views, the figures only show one stub in each layer. However, each layer includes a plurality of stubs (as shown in FIG. 1B).

Figure 3A:
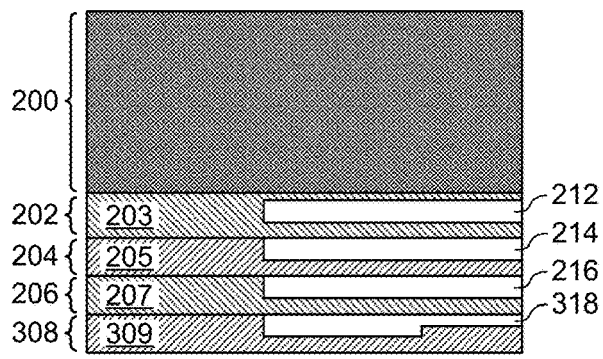
FIGS. 3A-3D are enlarged cross-sectional side views of an edge region of the multi-layer substrate of FIGS. 1A-1B including a modified conductive stub that is covered by an EMI shield.

Referring to FIG. 3A, top layer 202 includes dielectric (non-conductive) material 203, throughout which conductive stubs 212 are positioned. Middle layer 204 includes dielectric material 205, throughout which conductive stubs 214 are positioned. Middle layer 206 includes dielectric material 207, throughout which conductive stubs 216 are positioned. Lastly, bottom layer 308 includes dielectric material 309, throughout which conductive stubs 318 are positioned. At least some portions of conductive stubs 318 in the bottom layer are thinner than conductive stubs 212, 214, and 216 of the other layers of the substrate at the edge region 220, thereby ensuring clearance between conductive stubs 318 and the bottom surface 361 of the bottom layer 308 of the substrate after substrate separation.

Conductive stubs 212, 214, 216, and 318 are located at an edge region 220 of the substrate. During assembly, multiple substrates may be formed on a single board before the substrates are separated. The substrates may be separated using a saw (e.g., depaneling with a circular blade). During this separation process, edge portions of the conductive stubs at the edge 220 of the substrate may be deformed by the saw, due to the ductility of the conductive material (e.g., copper). Specifically, the edges of the conductive stubs may be expanded or elongated (e.g., in a vertical direction) by the saw, as shown in FIG. 3B.

Figure 3B:
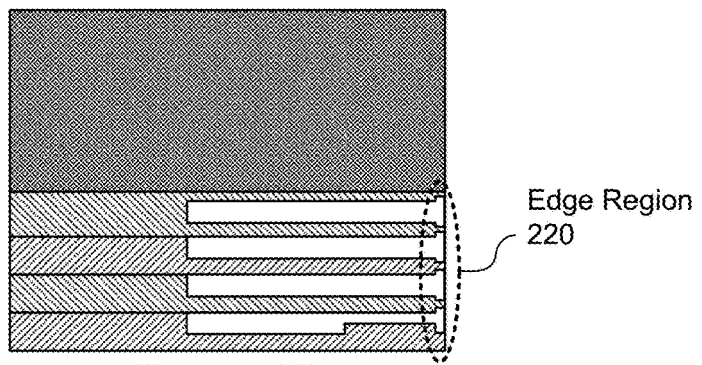
Figure 3C:
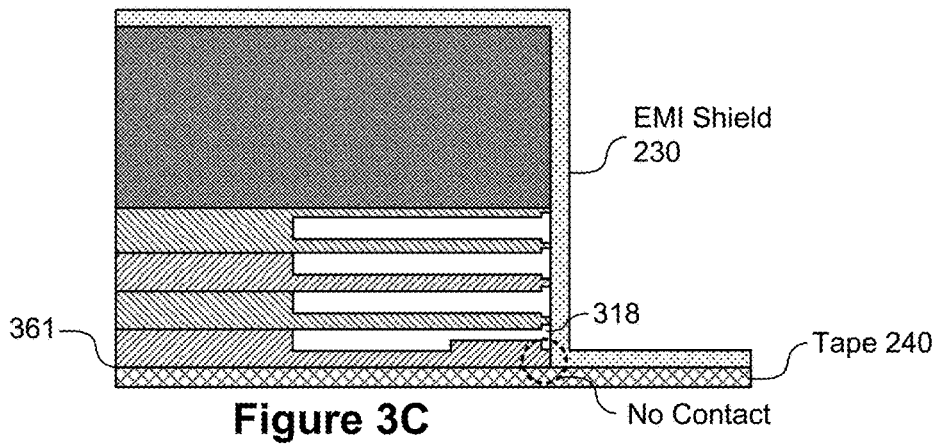
Figure 3D:
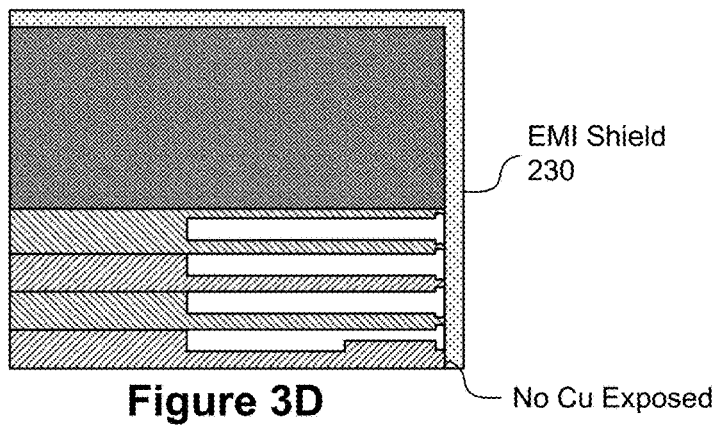

When installing the EMI shield 230 during assembly, adhesive tape 240 may be applied to the bottom of the package to temporarily fix the position of the substrate, as shown in FIG. 3C. While the tape 240 is affixed to the bottom surface 361 of the bottom layer 308, there is no contact between conductive stubs 318 and the tape 240. Thus, when the tape 240 is removed (referred to as detaping), the edges of conductive stubs 318 in the bottom layer are not left exposed, since the external force applied by the tape removal does not act on the conductive stubs 318 (due to the aforementioned clearance), as shown in FIG. 3D. Since all of or at least most of the conductive stubs of the substrate remain covered (not exposed) by the EMI shield 230, EMI characteristics of the package are improved.

Figure 3E:
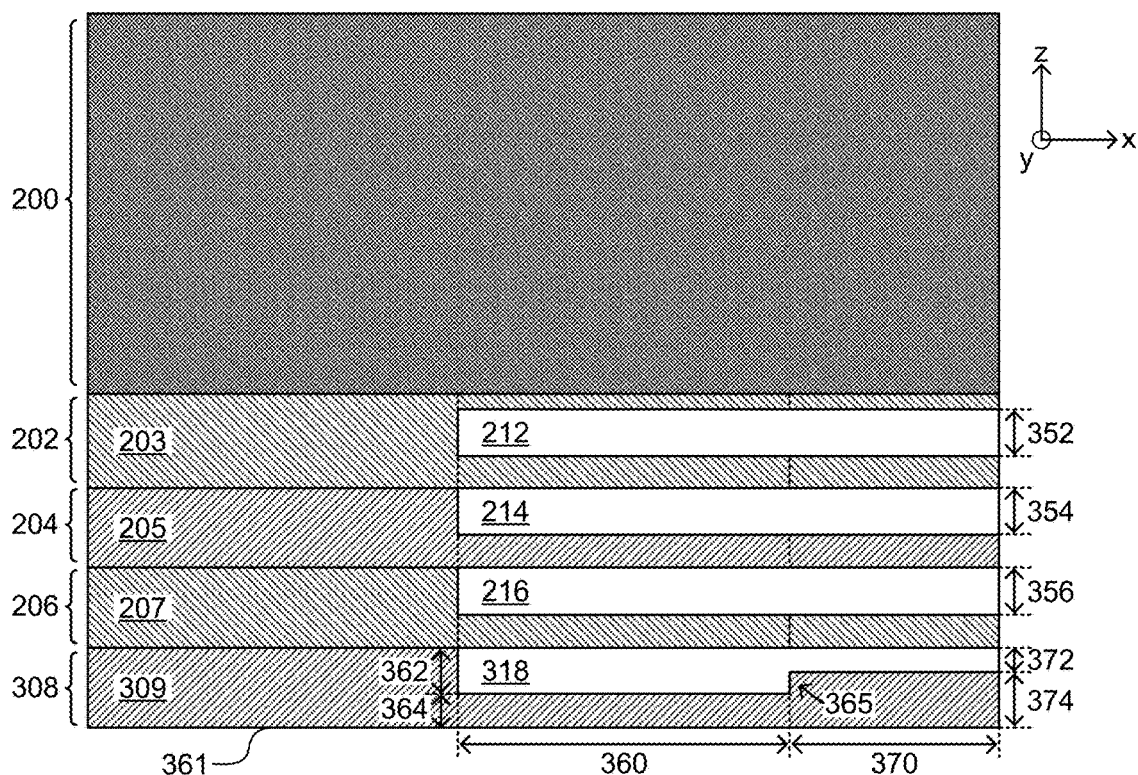
FIGS. 3E-3F are enhanced views of the edge region of the multi-layer substrate of FIGS. 3A-3B.
Figure 3F:
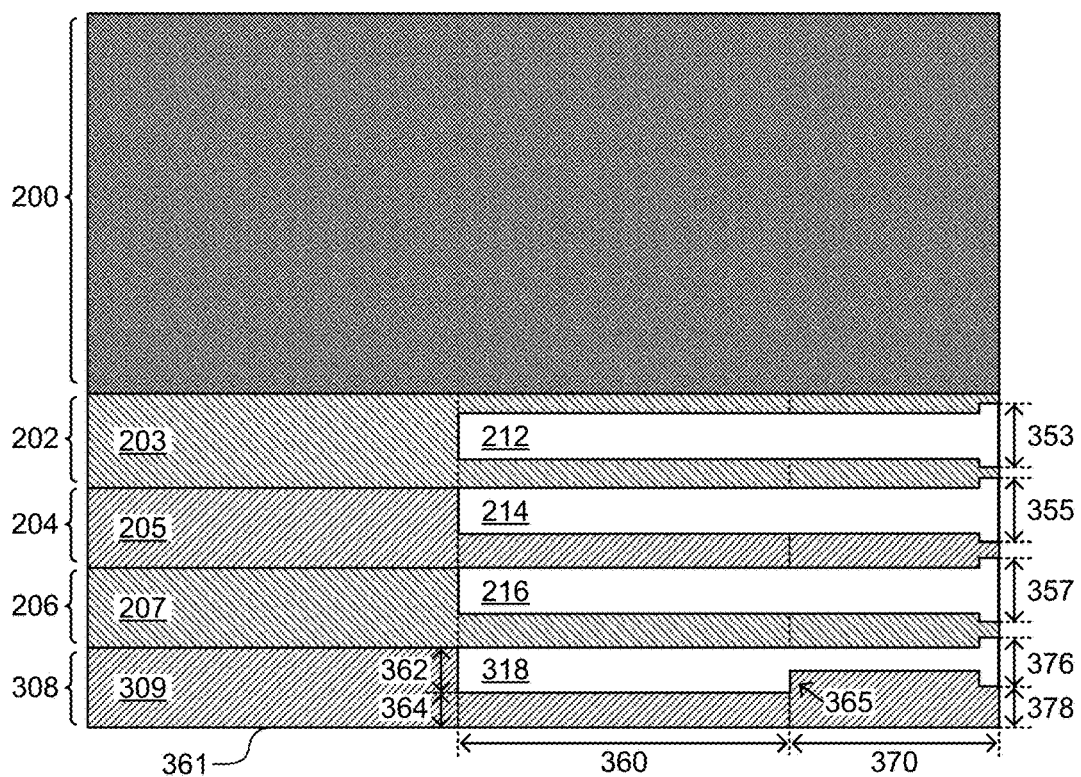

FIG. 3E is an enhanced views of the edge region of the multi-layer substrate of FIG. 3A (before substrate separation), and FIG. 3F is an enhanced views of the edge region of the multi-layer substrate of FIG. 3B (after substrate separation) in accordance with some implementations.

As shown in FIGS. 3E-3F, each of the conductive stubs includes two portions—a central portion 360 and an edge portion 370. The central portion 360 of the modified stub 318 has a thickness 362, and the edge portion 370 of the modified stub 318 has a thickness 372, which is less than thickness 362. Stated another way, the edge portion 370 of the modified stub 318 is thinner than the central portion 360 of the modified stub 318.

The conductive stubs 212, 214, and 216 in the other layers each of thicknesses 352, 354, and 356 that are greater than the thickness 372 of the edge portion of the conductive stub 318 in the bottom layer. In some implementations, thicknesses 352, 354, and 356 are equal to thickness 362.

The central portion 360 of the modified stub 318 has a first clearance 364 from the bottom surface 361 of the bottom layer 308 of the substrate, and the edge portion 370 of the modified stub 318 has a second clearance 374 from the bottom surface 361 of the bottom layer 308 of the substrate, wherein the second clearance 374 is greater than the first clearance 364. Thickness 372 and/or clearance 374 are chosen such that edge portion 370 of stub 318 is not in contact with adhesive tape 240 applied to the bottom surface 361 of the bottom layer 308 of the substrate during EMI shield assembly.

After substrate separation, as shown in FIG. 3F, the edges of the conductive stubs may be elongated (e.g., in a vertical direction), having expanded thicknesses 353, 355, 357, and 376. Thickness 376 of the edge portion of the bottom stub 318 is less than thicknesses 353, 355, and 357 of the stubs of the other layers due to the thinner edge portion of stub 318. Thus, bottom stub 318 has a clearance 378 that is still sufficient to prevent contact between the bottom stub 318 and adhesive tape 240 during EMI shield installation.

In some implementations, the central portion 360 and the edge portion 370 of bottom stub 318 are joined at a junction 365 comprising a step. In some implementations, junction 365 has a discrete (rather than a gradual) change in thickness. In some implementations, edge portion 370 of bottom stub 318 is integrally formed (continuous) with central portion 360 of bottom stub 318, and is positioned between the central portion 360 and the EMI shield 230 (as shown in FIG. 3D).

While FIGS. 3A-3F show one conductive stub per layer due the cross-sectional nature of the figures, the conductive stubs in each layer are representative of a plurality of conductive stubs in each layer. For example, conductive stub 318 (FIGS. 3A-3F) may correspond to one of a plurality of conductive stubs 112 (FIGS. 1A-1B) in the bottom layer, and so forth.

Thus, referring to FIGS. 3A-3F, a semiconductor device package includes: a substrate having a plurality of layers (202, 204, 206, 308) including a bottom layer 308 and a top layer 202; one or more dies mounted on and coupled to the top layer of the substrate with a plurality of bond wires (e.g., dies 120 in FIG. 1A, located in area 200), an EMI shield 230 encapsulating the substrate and the one or more semiconductor dies; a first plurality of conductive stubs (represented by stub 212) positioned around edges of the top layer 202 of the substrate, wherein each of the first plurality of conductive stubs includes an edge portion 370 having a first thickness 352 and in contact with the EMI shield 230; and a second plurality of conductive stubs (represented by stub 318) positioned around edges of the bottom layer 308 of the substrate, wherein each of the second plurality of conductive stubs includes an edge portion 370 having a second thickness (372 or 376) less than the first thickness 352 and in contact with the EMI shield 230.

In some implementations, each of the second plurality of conductive stubs 318 further includes a central portion 360 having a thickness 362 greater than the second thickness (372 or 376). In some implementations, each of the first plurality of conductive stubs 212 further includes a central portion 360 having a thickness 352 equal to the thickness 362 of the central portion 360 of each of the second plurality of conductive stubs 318.

In some implementations, the EMI shield 230 fully covers each of the first and second pluralities of conductive stubs 212 and 318 (as shown in FIGS. 3C-3D).

In some implementations, the second thickness (372 or 376) is set such that the second plurality of conductive stubs 318 does not come into contact with a tape adhesive layer 240 during an EMI shield assembly operation (during installation of the EMI shield 230, as shown in FIG. 3C).

In some implementations, the substrate further includes at least one middle layer (e.g., 204, 206), each including a third plurality of conductive stubs (e.g., 214, 216) in contact with the EMI shield 230; and each conductive stub of the third plurality of conductive stubs (214, 216) includes an edge portion 370 having a thickness (354, 356) greater than the second thickness (372 or 376). In some implementations, the thickness (354, 356) of the edge portion 370 of each of the third plurality of conductive stubs (214, 216) is equal to the first thickness 352.

In some implementations, each conductive stub (212, 214, 216, 318) included in the substrate is patterned over dielectric material (203, 205, 207, 309) and covered by a solder mask.

In some implementations, each conductive stub (212, 214, 216, 318) included in the substrate is copper, and the EMI shield 230 is metal, carbon, ceramic, or polymer.

In some implementations, for each of the second plurality of conductive stubs 318, the edge portion 370 is integrally formed with the central portion 360 and positioned between the central portion 360 and the EMI shield 230.

In some implementations, for each of the second plurality of conductive stubs 318, the edge portion 370 is joined with the central portion 360 at a junction 365 comprising a step. In some implementations, a bottom surface of each of the second plurality of conductive stubs 318 includes a step at the junction 365 of the edge portion 370 and the central portion 360.

In some implementations, the substrate includes a planar bottom surface 361, and a distance 364 from the bottom surface 361 of the substrate to the central portion 360 of each of the second plurality of conductive stubs 318 is less than a distance 374 from the bottom surface 361 of the substrate to the edge portion 370 of the second plurality of conductive stubs 318.

In another aspect of the implementations described herein, a multi-layer substrate for a semiconductor device includes: an edge region 370 configured for contact with an EMI shield 230; a central region 360 connected to the edge region 370; and a plurality of metal layers (each comprising a plurality of conductive stubs, e.g., 212, 214, 216, 318) separated by non-conductive layers (each comprising dielectric material, e.g., 203, 205, 207, 309), including a top metal layer 212 and a bottom metal layer 318; wherein the bottom metal layer 318 has a first thickness 362 in a location corresponding to the central region 360 of the substrate and a second thickness (372 or 376) less than the first thickness 362 in a location corresponding to the edge region 370 of the substrate.

In some implementations, the top metal layer 212 has a thickness 352 greater than the second thickness (372 or 376) in a location corresponding to the edge region 370 of the substrate. In some implementations, the top metal layer 212 has a thickness equal to the first thickness 352 in a location corresponding to the central region 360 of the substrate. In some implementations, the top metal layer 212 is configured for coupling to one or more dies (e.g., 120, FIG. 1A) with a plurality of bond wires.

In another aspect of the implementations described herein, a substrate includes a top surface configured for electrically connecting to one or more integrated circuits (e.g., 120, FIG. 1A) mounted thereon; a top layer 202 having first electrical contact means (conductive stubs 212) for contacting an EMI shield 230, the first electrical contact means having a first thickness 352; and a bottom layer 308 having second electrical contact means (conductive stubs 318) for contacting the EMI shield 230, the second electrical contact means having a second thickness (372 or 376) less than the first thickness 352.

In some implementations, the first electrical contact means 212 include a first plurality of conductive stub edges having the first thickness 352. In some implementations, the second electrical contact means 318 include a second plurality of conductive stub edges having the second thickness (372 or 376).

Figure 4:
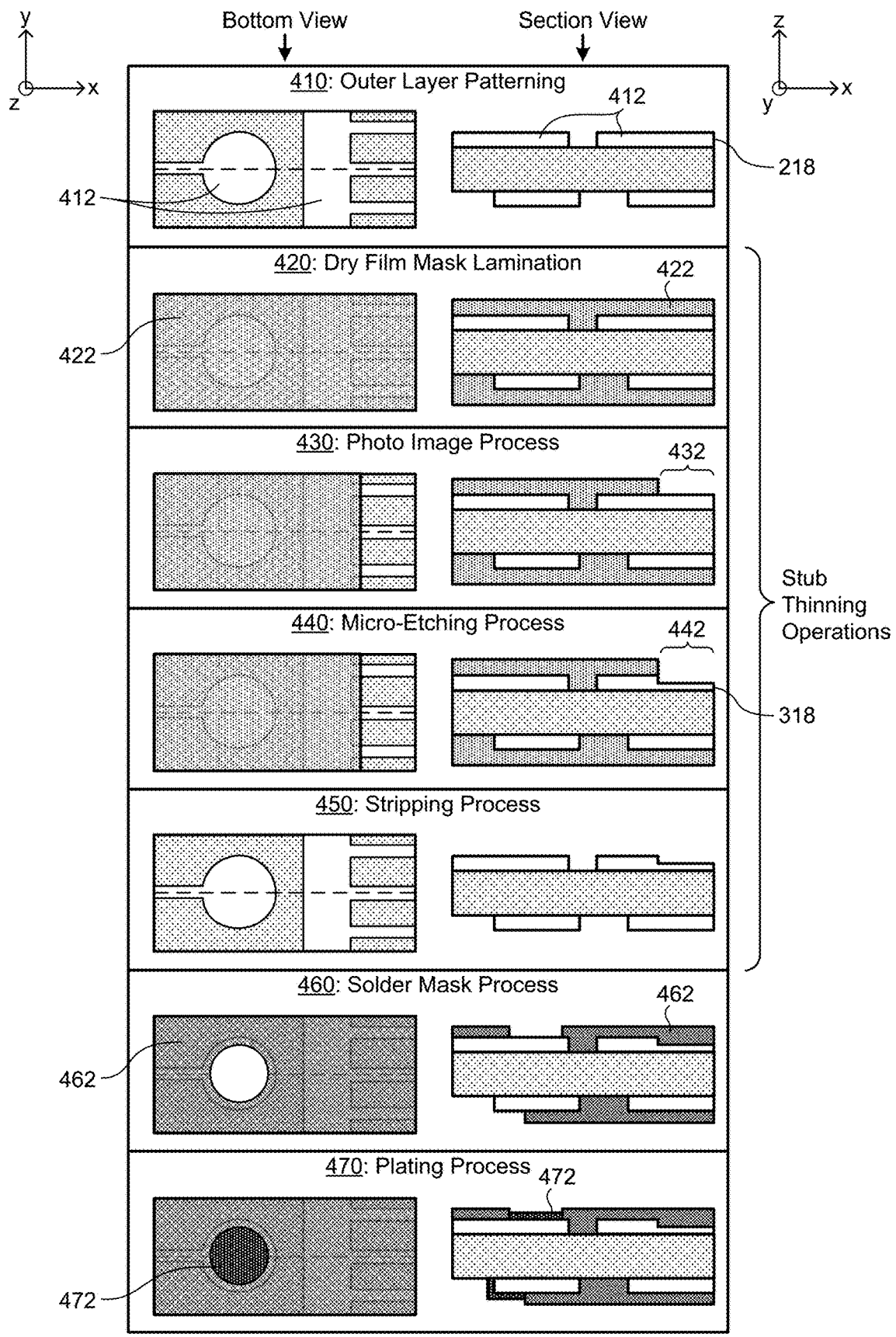
FIG. 4 is an exemplary diagram illustrating a method of assembling the multi-layer substrate of FIGS. 3A-3F including stub thinning operations in accordance with some implementations.

FIG. 4 is an exemplary diagram illustrating a method of assembling the multi-layer substrate of FIGS. 3A-3F including operations for thinning edge portions of conductive stubs of the bottom layer of the substrate in accordance with some implementations.

The left half of each operation in FIG. 4 is a bottom view, depicting an exemplary bottom surface 361 of the bottom layer of a multi-layer substrate, and the right half of each operation in FIG. 4 is a cross-sectional side view, depicting a cross section of the multi-layer substrate as denoted by the dashed line in the bottom view.

In operation 410, the outer layers are patterned with conductive material 412 (e.g., copper or any other material capable of conducting electricity). The conductive material 412 may be patterned by injecting metal onto a dielectric material composing the base of the substrate layer. The conductive material 412 may be patterned into traces, vias, stubs, and/or any other feature designed to transmit electrical signals throughout the substrate. The conductive material 412 in operation 410 includes a plurality of conductive stubs (e.g., stub 218, FIG. 2A).

In operation 420, a dry film mask lamination 422 is applied over the conductive material 412, and in operation 430, a photo image process removes a portion of the film mask lamination 422 at a region 432 corresponding to an edge portion (e.g., 370, FIG. 3E) of the conductive material forming the stubs. With the portion of the dry film mask lamination 422 removed from region 432, a micro-etching process 440 is applied to the conductive material at region 442 (corresponding to region 432), thinning the conductive material and forming thinner conductive stubs (e.g., stub 318, FIG. 3A). Upon completion of the micro-etching process, a stripping operation 450 removes the dry film mask lamination 422 from the conductive material 412. Thus, operations 420-450 are stub thinning operations that result in thinner conductive stubs at an edge region of the bottom layer of the multi-layer substrate (e.g., corresponding to edge portion 370, FIG. 3E).

In operation 460, a solder mask 462 is applied over the conductive material 412, leaving open areas at which electrical connections are to be made to subsequently applied conductive material. The solder mask 462 protects the conductive material 412 from being shorted or otherwise affected by other conductive material applied in subsequent assembly operations. In operation 470, plating material 472 (e.g., Ni Au plating) is applied to the areas of the conductive material 412 left open by the solder mask, thereby protecting the conductive material 412 in a way that allows electrical connections to be made to subsequently applied conductive material.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
    a substrate having a plurality of layers including a bottom layer and a top layer, the bottom layer including a dielectric material defining a bottom dielectric surface of the substrate and the top layer defining a top surface of the substrate that is opposite the bottom dielectric surface;
    one or more dies mounted on and electrically coupled to the top surface at the top layer of the substrate;
    an electromagnetic interference (EMI) shield encapsulating the substrate and the one or more semiconductor dies;
    a first plurality of conductive stubs positioned around edges of the top layer of the substrate, wherein each of the first plurality of conductive stubs includes an edge portion having a first thickness where each of the first plurality of conductive stubs directly physically contacts the EMI shield; and
    a second plurality of conductive stubs positioned around edges of the bottom layer of the substrate, wherein each of the second plurality of conductive stubs includes an edge portion having a second thickness where each of the second plurality of conductive stubs directly physically contacts the EMI shield, the second thickness being less than the first thickness, and each of the second plurality of conductive stubs further includes a central portion directly connected to the edge portion at a junction and having a thickness greater than a thickness of an entirety of the edge portion between the junction and the EMI shield,
    wherein the central portion does not physically contact the EMI shield, and
    wherein the central portion has a first clearance from the bottom dielectric surface of the substrate and the edge portion has a second clearance from the bottom dielectric surface that is greater than the first clearance.

2. The semiconductor device package of claim 1, wherein each of the first plurality of conductive stubs further includes a central portion having a thickness equal to the thickness of the central portion of each of the second plurality of conductive stubs.

3. The semiconductor device package of claim 1, wherein for each of the second plurality of conductive stubs, the edge portion is integrally formed with the central portion and positioned between the central portion and the EMI shield.

4. The semiconductor device package of claim 1, wherein the junction includes a step.

5. The semiconductor device package of claim 1, wherein a bottom surface of each of the second plurality of conductive stubs includes a step at the junction of the edge portion and the central portion.

6. The semiconductor device package of claim 1, wherein:
    the bottom dielectric surface of the substrate is a planar bottom surface; and
    a distance from the planar bottom surface of the substrate to the central portion of each of the second plurality of conductive stubs is less than a distance from the planar bottom surface of the substrate to the edge portion of the second plurality of conductive stubs.

7. The semiconductor device package of claim 1, wherein the EMI shield fully covers each of the first and second pluralities of conductive stubs.

8. The semiconductor device package of claim 1, wherein the second plurality of conductive stubs are not exposed outside of the EMI shield.

9. The semiconductor device package of claim 1, wherein:
    the substrate further includes at least one middle layer, each including a third plurality of conductive stubs in contact with the EMI shield; and
    each conductive stub of the third plurality of conductive stubs includes an edge portion having a thickness greater than the second thickness.

10. The semiconductor device package of claim 9, wherein the thickness of the edge portion of each of the third plurality of conductive stubs is equal to the first thickness.

11. The semiconductor device package of claim 1, wherein each conductive stub included in the substrate is patterned over dielectric material and covered by a solder mask.

12. The semiconductor device package of claim 1, wherein each conductive stub included in the substrate is copper, and the EMI shield is metal, carbon, ceramic, or polymer.

13. The semiconductor device package of claim 1, wherein the junction includes a step which is offset from the EMI shield.

14. A multi-layer substrate for a semiconductor device, the substrate comprising:
    an edge region in direct physical contact with an electromagnetic interference (EMI) shield;
    a central region connected to the edge region;
    a plurality of metal layers separated by non-conductive layers, including a top metal layer and a bottom metal layer;
    a dielectric material under the bottom metal layer defining a bottom dielectric surface of the substrate;
    wherein the top metal layer having a first thickness where the top metal layer directly physically contacts the EMI shield,
    wherein the bottom metal layer including a central portion in a location corresponding to the central region of the substrate and an edge portion in a location corresponding to the edge region of the substrate, the edge portion having a second thickness wherein the bottom metal layer directly physical contacts the EMI shield, the second thickness is less than the first thickness, a bottom surface of the edge portion directly contacts the dielectric material, wherein the central portion directly connected to the edge portion at a junction and having a thickness greater than a thickness of an entirety of the edge portion between the junction and the EMI shield, and wherein the central portion is offset from the bottom dielectric surface of the substrate by a first clearance, and the edge portion is offset from the bottom dielectric surface by a second clearance greater than the first clearance.

15. The multi-layer substrate for a semiconductor device of claim 14, wherein the junction includes a step.

16. The multi-layer substrate for a semiconductor device of claim 14, wherein the first thickness of the top metal layer is equal to the thickness of the central portion of the bottom metal layer.

17. The multi-layer substrate for a semiconductor device of claim 16, wherein the top metal layer is configured for coupling to one or more dies.

18. A semiconductor package comprising:

a substrate having a top surface electrically connected to one or more integrated circuits mounted thereon and a bottom dielectric surface defined by a dielectric material positioned opposite the top surface;

a top layer of the substrate having a first electrical contact contacting an electromagnetic interference (EMI) shield, the EMI shield encapsulating the one or more integrated circuits mounted to the substrate, the first electrical contact having a first thickness where the first electrical contact directly physically contacts the EMI shield; and a bottom layer of the substrate having a second electrical contact contacting the EMI shield, the second electrical contact including an edge portion having a second thickness where the second electrical contact directly physically contacts the EMI shield, the second thickness being less than the first thickness, and the second electrical contact further including a central portion directly connected to the edge portion at a junction and having a thickness greater than a thickness of an entirety of the edge portion between the junction and the EMI shield, wherein the central portion does not physically contact the EMI shield, and wherein the central portion of the second electrical contact has a first clearance from the bottom dielectric surface of the substrate and the edge portion of the second electrical contact has a second clearance from the bottom dielectric surface that is greater than the first clearance.

19. The semiconductor package of claim 18, wherein the first electrical contact includes a first plurality of conductive stub edges having the first thickness.

20. The semiconductor package of claim 19, wherein the second electrical contact includes a second plurality of conductive stub edges having the second thickness.

* * * * *